(12) United States Patent
Master et al.

(10) Patent No.: US 6,382,500 B1
(45) Date of Patent: May 7, 2002

(54) SOLDER REFLOW FURNACE WITH FLUX EFFLUENT COLLECTOR AND METHOD OF PREVENTING FLUX CONTAMINATION

(75) Inventors: Raj N. Master; Mohammad Zubair Khan; Maria Guardado, all of San Jose, CA (US); Sp Lee, Penang; Sofi Mohd, Kedah Darul Aman, both of (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/642,835

(22) Filed: Aug. 22, 2000

(51) Int. Cl.$^7$ .............................. B23K 1/00; B23K 5/22; B23K 31/02
(52) U.S. Cl. ..................... 228/180.1; 228/19; 228/42; 228/217
(58) Field of Search .................. 228/180.1, 42, 228/219, 19; 219/388, 390; 95/287

(56) References Cited

U.S. PATENT DOCUMENTS

| | | | |
|---|---|---|---|
| 4,580,716 A | * | 4/1986 | Barresi et al. .............. 228/219 |
| 4,735,001 A | * | 4/1988 | Mishina et al. ................. 34/73 |
| 4,951,401 A | * | 8/1990 | Suzuki et al. ................... 34/77 |
| 4,988,395 A | | 1/1991 | Taguchi et al. |
| 5,039,841 A | | 8/1991 | Kato et al. |
| 5,076,487 A | | 12/1991 | Bandyopadhyay et al. |
| 5,524,812 A | * | 6/1996 | Taniguchi et al. ....... 228/180.1 |
| 5,579,981 A | * | 12/1996 | Matsumura et al. ........... 228/19 |
| 5,611,476 A | * | 3/1997 | Soderlund et al. ............. 228/42 |
| 5,641,341 A | * | 6/1997 | Heller et al. ................... 95/287 |
| 5,820,641 A | * | 10/1998 | Gu et al. ....................... 55/269 |
| 5,874,737 A | | 2/1999 | Bytyn et al. |
| 5,894,128 A | | 4/1999 | Nakamori |
| 5,993,500 A | * | 11/1999 | Bailey et al. ............... 55/385.6 |
| 6,146,448 A | * | 11/2000 | Shaw et al. .................... 95/287 |

FOREIGN PATENT DOCUMENTS

JP       2000-140502    *   5/2000    ................ 219/388

* cited by examiner

Primary Examiner—Tom Dunn
Assistant Examiner—L. Edmondson

(57) ABSTRACT

When soldering semiconductor devices in a solder reflow furnace flux is vaporized and carried to the furnace exhaust pipe. The flux condenses on the walls of the exhaust pipe and drips back into the furnace contaminating production parts. A solder reflow furnace with a flux effluent collector prevents flux drip-back. The flux effluent collector has an exhaust gas heater that maintains flux effluent in a gaseous state, a flux cooler, to subsequently condense flux, and a flux condensation region where the flux condenses. The flux condensation region is offset from the furnace's exhaust opening so that condensed flux cannot drip back into the furnace.

22 Claims, 3 Drawing Sheets

SOLDER REFLOW FURNACE WITH FLUX EFFLUENT COLLECTOR AND METHOD OF PREVENTING FLUX CONTAMINATION

TECHNICAL FIELD

This invention generally relates to the field of semiconductor device manufacturing, and more particularly, to reflow furnaces and the processing of semiconductor devices in reflow furnaces.

BACKGROUND OF THE INVENTION

In the manufacture of semiconductor devices, components are conventionally joined together by soldering. In order to efficiently solder in a production environment, solder reflow furnaces are used. In a solder reflow furnace, semiconductor components are placed on a conveyer belt and conveyed through a tunnel-type furnace. The semiconductor components are heated to above the melting point of the solder while in the furnace, permitting the solder to flow and to bond the parts. To provide a good solder joint the solder is typically heated to about 50° C. above its melting point. Solder reflow furnaces are usually operated at temperatures from about 200° C. to about 400° C.

Typically, reflow furnaces are heated by either a hot gas or infrared radiation. In general, then, solder reflow furnaces can be classified as radiation-types or hot gas-types. The radiation-type reflow furnace is one in which a number of paneled heaters are disposed in the upper and lower portions of a tunnel and semiconductor devices are heated by the heat radiated from the panel heaters. The inside of the furnace is heated to a suitable temperature for soldering by controlling the current supplied to the panel heaters. The radiation emitted from the panel heaters can either be near or far infrared radiation.

A solder reflow furnace of the hot gas-type is one in which hot gas is circulated past a heater providing a constant heating temperature. Typically, nitrogen is the gas of choice in a reflow furnace. However, other inert gases can also be used, as well as hydrogen. Although nitrogen is not a class VIIIA element, as used herein nitrogen will be considered an inert gas. Inert gases and hydrogen are used in both hot gas-type and radiation-type reflow furnaces to limit the amount of oxygen present in the furnace. Low oxygen levels are desirable to prevent oxidation of the components being soldered.

Fluxes are used with solder to promote soldering. When the solder is heated, the flux is evaporated and the solder fumes are carried by the gas circulating in the furnace. The evaporated flux is carried out through the furnace exhaust pipe. In a high volume production environment, flux effluent condenses on the inside wall of the furnace exhaust pipe. As the build-up of the flux effluent condensation increases, it starts to drip back into the furnace onto the production parts. The flux will contaminate production parts and cause rejection of the parts. Not only will the semiconductor device become dirty, but the flux causes a decrease in electrical resistance, corrosion, and other problems which adversely affects the electrical components of the semiconductor device.

SUMMARY OF THE INVENTION

There exists a need in the solder reflow art to control and/or eliminate the problem of flux dripping back into the solder reflow furnace and contaminating semiconductor devices.

This and other needs are met by embodiments of the present invention which provide a solder reflow furnace comprising: a heater that heats the solder reflow furnace to an operating temperature, a conveyor that conveys semiconductor devices through the solder reflow furnace, an exhaust opening for venting gases from the solder reflow furnace and a flux effluent collector connected to the exhaust opening.

The earlier stated needs are also met by another embodiment of the present invention which provides a device for preventing flux drip-back into solder reflow furnaces comprising: a solder reflow furnace exhaust pipe and an exhaust gas heater and flux cooler both positioned on the exhaust pipe. A flux condensation region of the exhaust pipe is located adjacent to the flux cooler. A flux drain conduit connects the flux condensation region to a flux collection container.

The present invention also provides a method for preventing flux contamination of semiconductor devices. Semiconductor devices are conveyed through a solder reflow furnace having an exhaust opening and a flux effluent collector. Gas flows through the solder reflow furnace, wherein at least some of the gas exits the furnace through the exhaust opening and flux effluent collector. The gas which passes through the flux effluent collector is heated to maintain flux effluent carried in the exhaust in a gaseous state. Subsequently, the exhaust gas is cooled in a flux condensation region to condense the flux effluent. Then, the condensed flux is collected in a manner such that the condensed flux does not re-enter the reflow furnace.

The solder reflow furnace of the present invention provides cleaner semiconductor devices with higher yield. The solder reflow furnace arrangement prevents flux drip-back into solder reflow furnaces. In addition to a higher yield of cleaner parts, the present invention also provides for disposing of flux effluent in an ecologically sound manner.

The foregoing and other features, aspects and advantages of the present invention will become more apparent from the following detailed description of the present invention when taken in conjunction with the accompanying drawings.

DETAILED DESCRIPTION

The present invention addresses the problem of flux effluent dripping back into the reflow furnace and contaminating production parts. The invention solves this problem, in part, by methods and arrangements which prevent flux drip-back into reflow furnaces.

This invention allows production of semiconductor devices with increased yields and increased reliability at reduced costs. This is accomplished by preventing flux condensate from dripping back from the exhaust pipe of solder reflow furnaces into the solder reflow furnace. Flux drip-back is prevented by the use of flux effluent collector attached to the furnace exhaust pipe. An exhaust gas heater maintains the flux effluent in a gaseous state as it exits the furnace. A flux cooler condenses the flux in a flux condensation region which is offset from the furnace exhaust opening so that condensed flux cannot drip back into the furnace. The condensed flux is removed from the exhaust pipe via a conduit and is stored in a collection container.

The term semiconductor devices as used herein is not to be limited to the specifically disclosed embodiments. Semiconductor devices as used herein includes a wide variety of electronic devices including flip chips, flip chip/package assemblies, transistors, plurality of transistors, capacitors, microprocessors, random access memories, etc. In general, semiconductor devices refers to any electrical device comprising semiconductors.

The present invention will be illustrated by reference to a process of joining flip chips to packages. It is understood by one of ordinary skill in the art that this invention is not limited to joining flip chips to packages.

Figure 5:
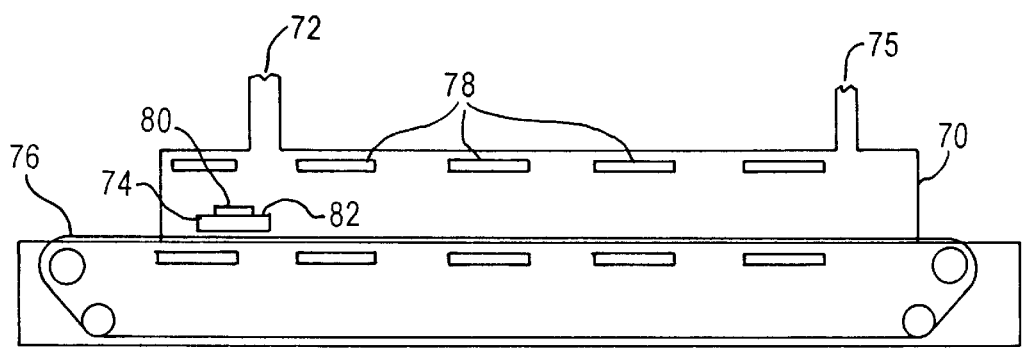
FIG. 5 shows a prior art solder reflow furnace.

FIG. 5 illustrates a prior art reflow furnace. In FIG. 5 semiconductor device 74, comprising a flip chip 80 and package 82, is loaded on conveyor 76 of solder reflow furnace 70. While semiconductor device 74 is being conveyed through solder reflow furnace 70, heating elements 78 heats the solder on the device 74 to above its melting point so that it can bond the flip chip 80 to its accompanying package 82. In order to prevent oxidation, an inert gas flows into the furnace 70 through conduit 75 and exits through the furnace exhaust 72. When flip chip/package assemblies 74 pass through the reflow furnace 70, flux on the semiconductor device 74 evaporates and passes out through furnace exhaust 72. The inert gas carries the evaporated flux through the furnace exhaust 72. In a high volume production environment flux effluent condenses on the sides of exhaust 72. As build-up grows, the condensed flux effluent, drips back into the furnace on the production parts 74. Flux contamination leads to low process yields.

Figure 1:
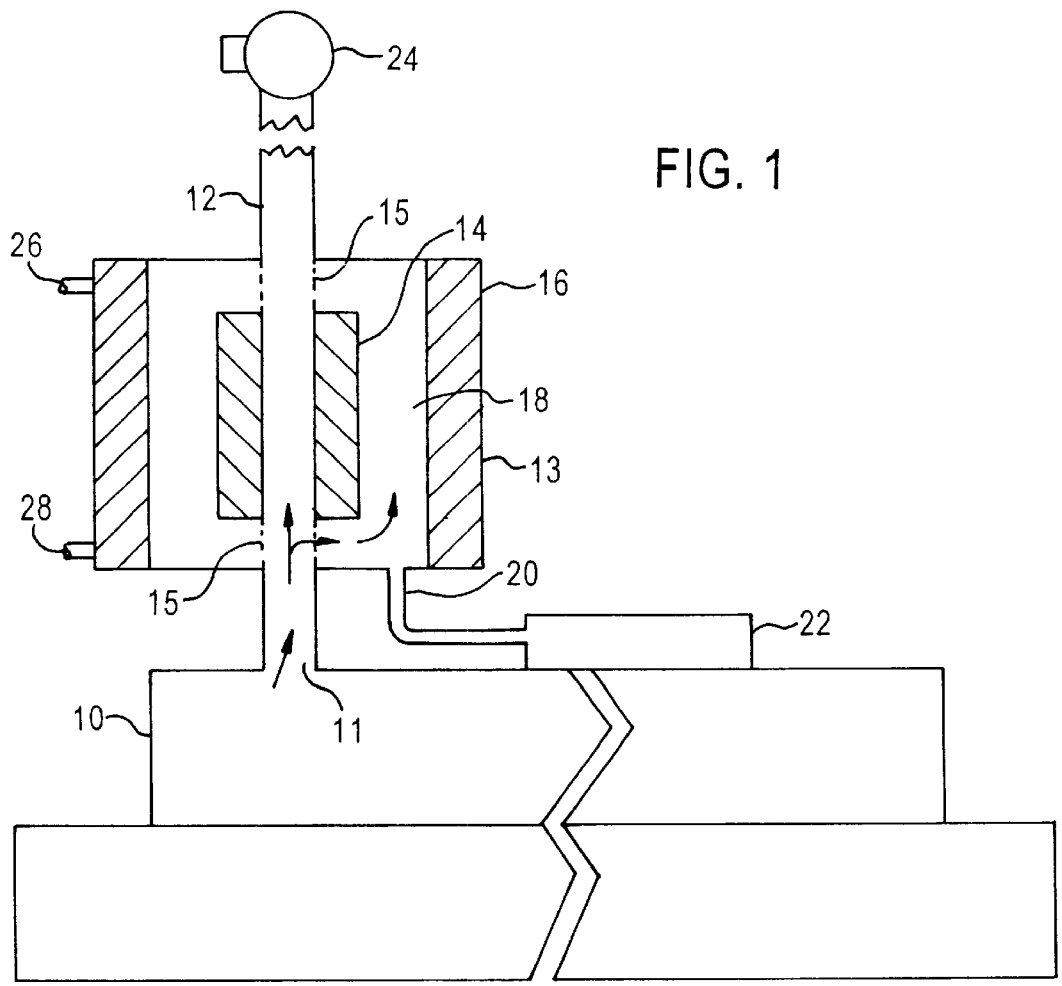
FIG. 1 is a cross-section of a reflow furnace and exhaust arrangement in accordance with an embodiment of the present invention.

Embodiments of the present invention that solve the problem of flux drip-back will be explained below in reference to the Figures. FIG. 1 shows an embodiment of the present invention wherein solder reflow furnace 10 comprises an exhaust opening 11 for venting gases from the solder reflow furnace 10 and a flux effluent collector 13 for preventing flux from dripping back into the furnace 10. Solder reflow furnace 10 comprises conventional heaters, not shown, and conventional conveyors for conveying the semiconductor devices, also not shown.

The heat required to melt the solder evaporates the flux on the semiconductor device. The evaporated flux is carried by the exhaust gases through the exhaust opening 11. The exhaust gases, with the evaporated flux, then travels through the flux effluent collector 13. The exhaust gases can flow straight up through the exhaust pipe 12 where they are heated, by a heater 14, in order to maintain the flux in a gaseous state. The gases can also flow through the flux condensation region 18 where a coolant jacket 16 cools the exhaust gas so that flux condenses only within the flux condensation region 18.

Exhaust gases can pass into the flux condensation region 18 by one or more openings 15 provided in the exhaust pipe 12 at either end of the heater 14. The condensed flux falls or drips to the bottom of the flux effluent collector 13 where it then can enter the flux drain conduit 20 to be drained away from a flux effluent collector 13 and is subsequently collected in a flux collection container 22. The flux condensation region 18 is offset from the exhaust opening 11 so that condensed flux can not drip back into the reflow furnace 10. The reflow furnace 10 has an exhaust fan 24 in the exemplary embodiment that aids in drawing the flux effluent through the exhaust opening 11.

In certain embodiments, the heater 14 is a conventional heating element such as an electric resistance heater or an infrared heater. In order to maintain the flux in a gaseous state, the heater 14 heats the flux to a temperature of about 175° C. to about 400° C., or more specifically to a temperature of about 220° C. to about 250° C.

The coolant can be selected from conventional fluid coolants including air, inert gas, water, silicate esters, ethylene glycol, fluorocarbons, poly alpha olefins, or mixtures thereof. Exemplary fluorocarbon coolants include Fluorinert manufactured by 3M Company. The coolant is introduced into the coolant jacket 16 through coolant inlet 26 and exits at coolant outlet 28. The coolant is recirculated through a chiller (not shown) and then reintroduced into coolant inlet 26.

The flux drain conduit 20 is located at the lowest point of the flux effluent collector 13 to provide for complete removal of the condensed flux. The flux collection container 22 can be removeably attached to the flux drain conduit 20 to allow for easy removal of the flux collection container 22 when it becomes filled with flux. A removeable flux collection container 22 also allows for ecologically safe disposal and/or recycling of flux material.

Figure 1A:
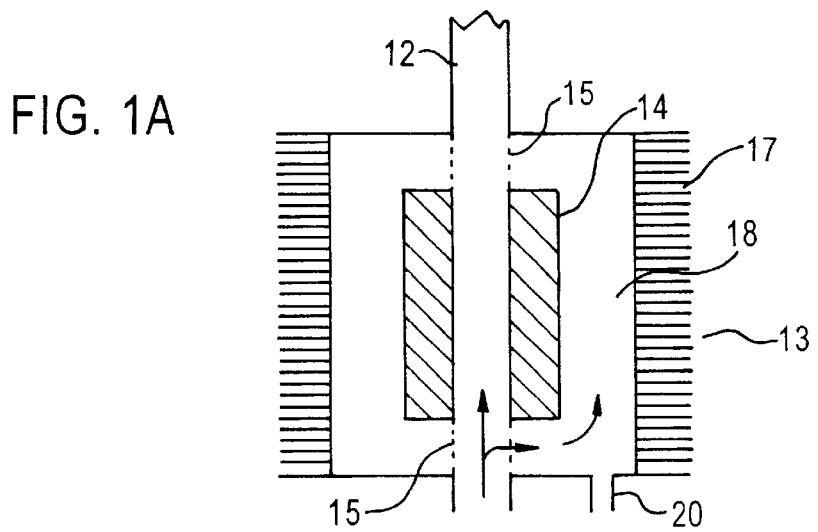
FIG. 1A depicts an embodiment of the flux effluent collector in which the flux cooler comprises a plurality of fins.

As an alternative to the coolant jacket 16, in other embodiments the cooler comprises a plurality of heat radiation members projecting externally from the flux effluent collector 13. The plurality of heat radiation members can comprise fins; such as flat fins, folded fins, or pin fins. FIG. 1A illustrates an embodiment where the flux cooler comprises a plurality of fins 17 projecting externally from flux effluent collector 13. In the event that the cooler comprises fins, efficient cooling can be achieved by forcing air or an inert gas across the external fins 17.

Figure 2:
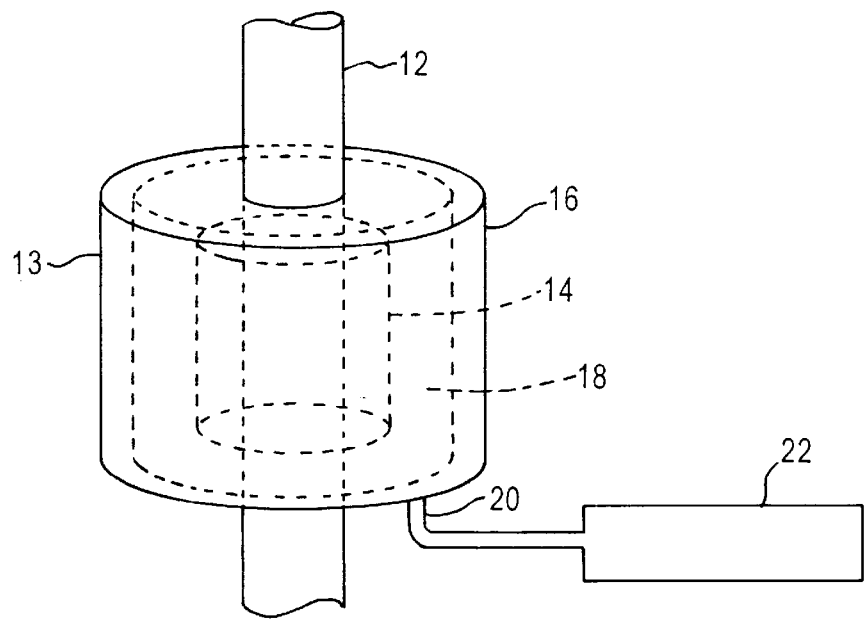
FIG. 2 shows a detailed sectional view of the flux effluent collector of FIG. 1 with a cylindrical concentric arrangement in accordance with embodiments of the present invention.

FIG. 2 shows a detailed view of the flux effluent collector 13 depicted in the embodiment of FIG. 1. The flux effluent collector 13 of FIG. 2 has a cylindrical concentric shape, wherein the elements of the flux effluent collector 13 are arranged concentrically from the exhaust pipe 12 as the innermost component. Heater 14 closely surrounds the wall of the exhaust pipe 12, and may be attached thereto. Extending further out radially is the flux condensation region 18 and the coolant jacket 16.

Figure 3:
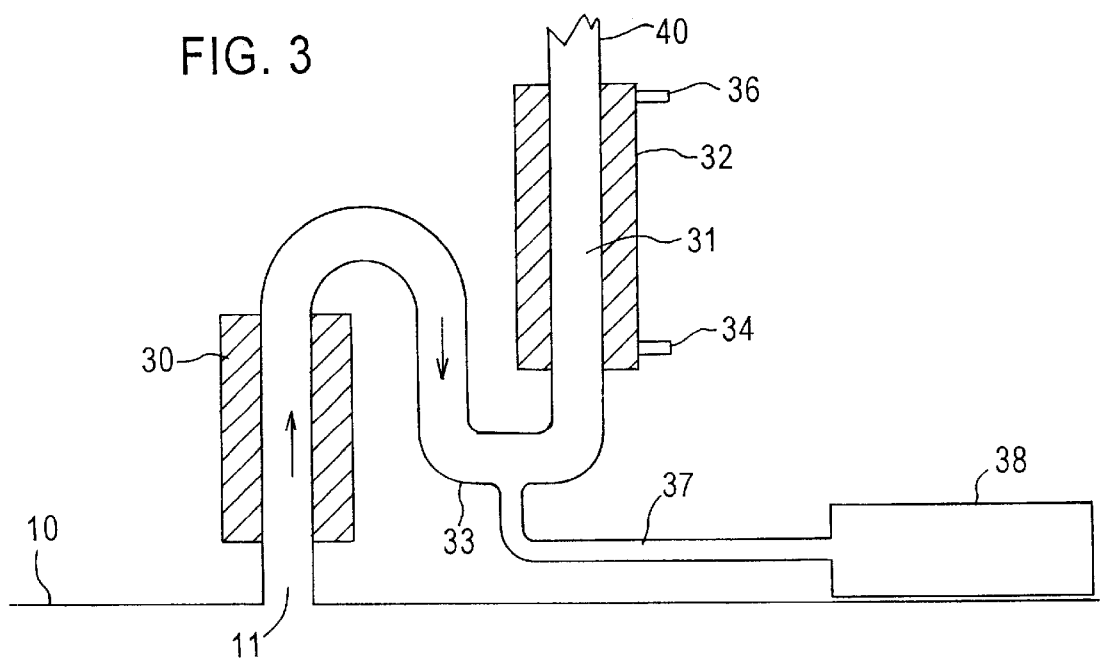
FIG. 3 depicts an embodiment of the present invention in which the flux effluent collection unit is trap shaped.

FIG. 3 illustrates another embodiment of the invention where the exhaust pipe 40 forms a single exhaust path, unlike the embodiment illustrated in FIG. 1, where exhaust pipe 12 branched off into the flux condensation region. In this embodiment, the exhaust pipe 40 is shaped like a trap. In particular, the exhaust pipe 40 is S-shaped. Starting from the exhaust opening 11 the effluent gas rises through the exhaust pipe 40 where it encounters heater 30 which maintains the flux in a gaseous state. The effluent gas then proceeds down the exhaust pipe 40 towards the base 33 of the trap and then up again into the flux condensation region 31. Coolant jacket 32 cools the flux so that it condenses in flux condensation region 31. Fluid coolant is provided through coolant inlet 34 and the fluid exits the jacket at coolant outlet 36. The condensed flux drips or falls back down exhaust pipe 40 to the base 33 of the trap where it enters the flux drain conduit 37 and continues flowing to the flux collection container 38.

An advantage of the embodiment of FIG. 3 is the low cost of implementation of the flux effluent collector due to its elegant design. In this embodiment the exhaust pipe 40 is bent to the desired configuration and then heater 30 and coolant jacket 32 are attached to the external walls of exhaust pipe 40.

Figure 4:
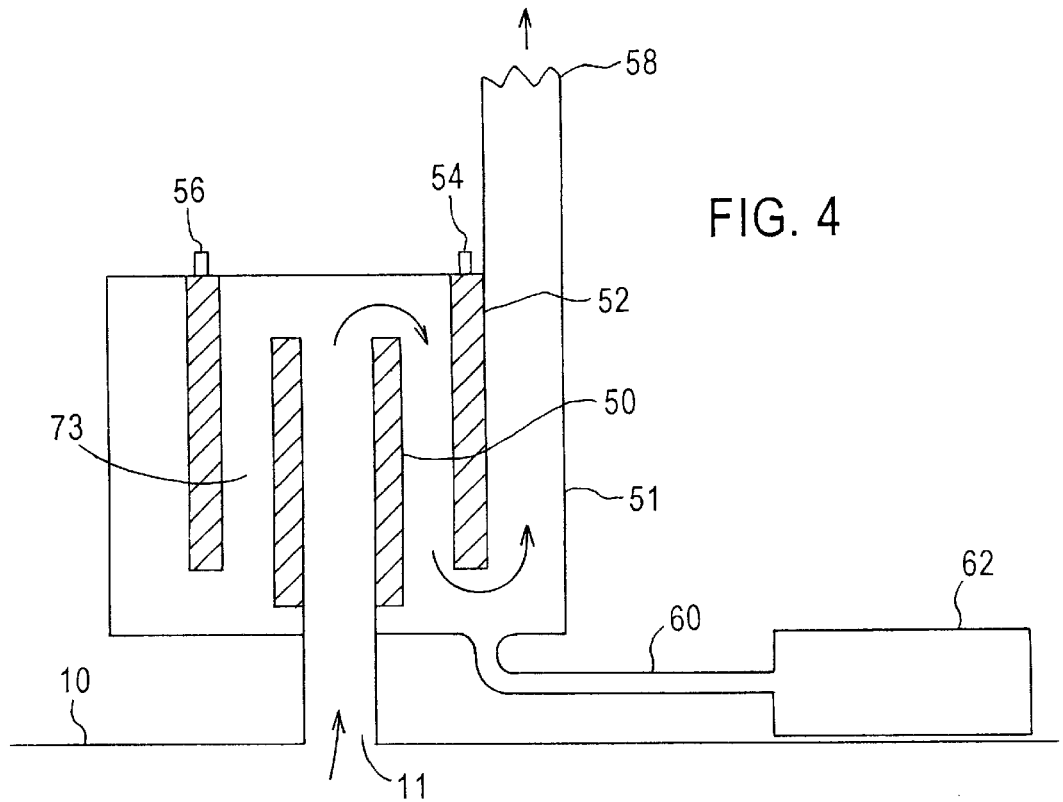
FIG. 4 depicts another embodiment of the present invention in which the exhaust gas flows past two sides of a coolant jacket.

FIG. 4 illustrates another embodiment of the present invention. In this embodiment, the effluent gas exits solder reflow furnace 10 at exhaust opening 11 and continues upward, past heater 50, and is then directed downward past coolant jacket 52 and then upward, again past coolant jacket 52, and then out through exhaust pipe 58. Flux is condensed in the flux condensation regions 73 where it drips down to the base of the flux effluent collector 51 through the flux drain conduit 60 and into flux collection container 62. Fluid coolant is introduced into the coolant jacket by coolant inlet 54 and exits coolant jacket 52, through coolant outlet 56.

This embodiment provides a compact flux effluent collector because the effluent gas contacts the coolant jacket on both sides of the coolant jacket so that the coolant jacket does not need to be as long as the coolant Jackets in earlier described embodiments. The embodiment of FIG. 4 provides more efficient removal of the flux from the exhaust effluent because the effluent contacts a greater surface area of the coolant jacket while passing through the flux effluent collector.

The flux effluent collector can be a separate module which can be removeably attached to the solder reflow furnace. The modular design allows for easy removal of the flux effluent collector to allow cleaning, repair, or replacement of the flux effluent collector if required.

The device, solder reflow furnace, and method of the present invention provides a manufacturing process which produces cleaner parts with higher yields. The flux effluent collector of the instant invention prevents flux drip-back which can contaminate semiconductor devices being processed in a solder reflow furnace.

It is understood that the embodiments described herein represent specific embodiments and are not to be construed to limit the scope of the claims. One of ordinary skill in the art would recognize that there is a broad range of embodiments which are within the scope of the instant disclosure and claims.

What is claimed is:

1. A solder reflow furnace comprising:
   a heater for heating the solder reflow furnace to an operating temperature;
   a conveyor for conveying semiconductor devices through the solder reflow furnace;
   an exhaust opening for venting gases from the solder reflow furnace; and
   a flux effluent collector connected to the exhaust opening, wherein the flux effluent collector comprises an exhaust pipe coupled to the exhaust opening comprising a flux condensation region of the exhaust pipe offset from the exhaust opening, an exhaust gas heater positioned on the exhaust pipe, a flux cooler positioned on the exhaust pipe, a flux collection container, and a flux drain conduit connecting the flux condensation region to the flux collection container, wherein the flux effluent collector is configured in a concentric manner in the following order from inside to outside:
   exhaust pipe, exhaust gas heater, flux condensation region, and flux cooler.

2. The solder reflow furnace of claim 1, wherein the flux cooler comprises a coolant jacket.

3. The solder reflow furnace of claim 1, wherein the flux heater is attached to the exterior wall of the exhaust pipe to heat the exhaust pipe.

4. A device for preventing flux drip-back into solder reflow furnaces comprising:
   a solder reflow furnace exhaust pipe;
   an exhaust gas heater positioned on the exhaust pipe;
   a flux cooler positioned on the exhaust pipe;
   a flux condensation region of the exhaust pipe adjacent to the flux cooler;
   a flux drain collection container; and
   a flux drain conduit connecting the flux condensation region to the flux collection container, wherein the device is arranged in a concentric manner in the following order from inside to outside:
   exhaust pipe, exhaust gas heater, flux condensation region, and flux cooler.

5. The device for preventing flux drip-back of claim 4, wherein the flux cooler comprises a coolant jacket.

6. The device for preventing flux drip-back of claim 4, wherein the flux cooler comprises a plurality of heat radiation members projecting externally from the exhaust pipe outer wall.

7. A method for preventing flux contamination of semiconductor devices comprising:
   conveying at least one semiconductor device through a solder reflow furnace, the solder reflow furnace having an exhaust opening and a flux effluent collector, wherein the flux effluent collector comprises an exhaust pipe coupled to the exhaust opening, comprising a flux condensation region offset from the exhaust opening, an exhaust gas heater positioned on the exhaust pipe, a flux cooler positioned on the exhaust pipe, wherein the flux effluent collector is configured in a concentric manner in the following order from inside to outside:
   exhaust pipe, exhaust gas heater, flux condensation region, and flux cooler;
   flowing a gas through the solder reflow furnace, wherein at least some of the gas exits the furnace through the exhaust opening and flux effluent collector;
   heating the gas which passes through the flux effluent collector to maintain flux effluent carried in the exhaust gas in a gaseous state;
   cooling the exhaust gas in the flux condensation region to condense the flux; and
   collecting the condensed flux to prevent the condensed flux from re-entering the reflow furnace.

8. The method for preventing flux contamination of semiconductor devices according to claim 7, wherein the flux cooler comprises a coolant jacket.

9. The method for preventing flux contamination of semiconductor devices according to claim 8, wherein a coolant comprising air, inert gas, water, silicate esters, ethylene glycol, poly alpha olefins, fluorocarbons, or mixtures thereof, is passed through the coolant jacket.

10. The method for preventing flux contamination of semiconductor devices according to claim 7, wherein the cooler comprises a plurality of heat radiation members projecting externally from the flux effluent collector.

11. A solder reflow furnace comprising:
    a heater for heating the solder reflow furnace to an operating temperature;
    a conveyor for conveying semiconductor devices through the solder reflow furnace;

an exhaust opening for venting gases from the solder reflow furnace; and a flux effluent collector connected to the exhaust opening, wherein the flux effluent collector comprises an exhaust pipe coupled to the exhaust opening comprising a flux condensation region of the exhaust pipe offset from the exhaust opening, an exhaust gas heater positioned on the exhaust pipe, a flux cooler positioned on the exhaust pipe, a flux collection container, and a flux drain conduit connecting the flux condensation region to the flux collection container, wherein the exhaust pipe is configured as a trap having a base, wherein the flux drain conduit is attached to the exhaust pipe at the base of the trap.

12. The solder reflow furnace of claim 11, wherein the exhaust gas heater is attached to the wall of the exhaust pipe upstream from the flux drain conduit and the flux cooler is attached to the wall of the exhaust pipe downstream from the flux drain conduit.

13. The solder reflow furnace of claim 11, wherein the flux cooler comprises a coolant jacket.

14. The solder reflow furnace of claim 11, wherein the flux heater is attached to the exterior wall of the exhaust pipe to heat the exhaust pipe.

15. A device for preventing flux drip-back into solder reflow furnaces comprising:

a solder reflow furnace exhaust pipe;

an exhaust gas heater positioned on the exhaust pipe;

a flux cooler positioned on the exhaust pipe;

a flux condensation region of the exhaust pipe adjacent to the flux cooler;

a flux drain collection container; and a flux drain conduit connecting the flux condensation region to the flux collection container, wherein the exhaust pipe is configured as a trap having a base, wherein the flux drain conduit is attached to the exhaust pipe at the base of the trap.

16. The device for preventing flux drip-back of claim 15, wherein the exhaust gas heater is attached to the wall of the exhaust pipe at a location upstream from the flux drain conduit and the flux cooler is attached to the wall of the exhaust pipe at a location downstream from the flux drain conduit.

17. The device for preventing flux drip-back of claim 15, herein the flux cooler comprises a coolant jacket.

18. The device for preventing flux drip-back of claim 15, herein the flux cooler comprises a plurality of heat radiation members projecting externally from the exhaust pipe outer wall.

19. A method for preventing flux contamination of semiconductor devices comprising:

conveying at least one semiconductor device through a solder reflow furnace, the solder reflow furnace having an exhaust opening and a flux effluent collector, wherein the flux effluent collector comprises an exhaust pipe coupled to the exhaust opening comprising a flux condensation region of the exhaust pipe offset from the exhaust opening, an exhaust gas heater positioned on the exhaust pipe, a flux cooler positioned on the exhaust pipe, a flux collection container, and a flux drain conduit connecting the flux condensation region to the flux collection container, wherein the exhaust pipe is configured as a trap having a base, wherein the flux drain conduit is attached to the exhaust pipe at the base of the trap;

flowing a gas through the solder reflow furnace, wherein at least some of the gas exits the furnace through the exhaust opening and flux effluent collector;

heating the gas which passes through the flux effluent collector to maintain flux effluent carried in the exhaust gas in a gaseous state;

cooling the exhaust gas in the flux condensation region to condense the flux; and collecting the condensed flux to prevent the condensed flux from reentering the reflow furnace.

20. The method for preventing flux contamination of semiconductor devices according to claim 19, wherein the cooler comprises a coolant jacket.

21. The method for preventing flux contamination of semiconductor devices according to claim 20, wherein a coolant comprising air, inert gas, water, silicate esters, ethylene glycol, poly alpha olefins, fluorocarbons, or mixtures thereof, is passed through the coolant jacket.

22. The method for preventing flux contamination of semiconductor devices according to claim 19, wherein the cooler comprises a plurality of heat radiation members projecting externally from the flux effluent collector.

* * * * *